United States Patent
Kato et al.

(10) Patent No.: US 10,265,727 B2
(45) Date of Patent: Apr. 23, 2019

(54) LAYERED COATING FILM, AND COATED ARTICLE

(71) Applicant: MAZDA MOTOR CORPORATION, Hiroshima (JP)

(72) Inventors: Hidekazu Kato, Hiroshima (JP); Kana Haruki, Hiroshima (JP); Naoto Waku, Hiroshima (JP); Kouji Teramoto, Hiroshima (JP)

(73) Assignee: MAZDA MOTOR CORPORATION, Hiroshima (JP)

(*) Notice: Subject to any disclaimer, the term of this patent is extended or adjusted under 35 U.S.C. 154(b) by 178 days.

(21) Appl. No.: 15/324,066

(22) PCT Filed: Oct. 29, 2015

(86) PCT No.: PCT/JP2015/005447
§ 371 (c)(1),
(2) Date: Jan. 5, 2017

(87) PCT Pub. No.: WO2016/079932
PCT Pub. Date: May 26, 2016

(65) Prior Publication Data
US 2017/0203331 A1  Jul. 20, 2017

(30) Foreign Application Priority Data

Nov. 21, 2014 (JP) .................. 2014-236686

(51) Int. Cl.
*B05D 7/00* (2006.01)
*B32B 7/02* (2019.01)
(Continued)

(52) U.S. Cl.
CPC ............... *B05D 7/50* (2013.01); *B32B 7/02* (2013.01); *B32B 27/20* (2013.01); *C25D 13/04* (2013.01); *C25D 13/12* (2013.01); *C25D 15/00* (2013.01)

(58) Field of Classification Search
CPC .. B32B 7/00–7/14; B32B 15/00–15/20; B32B 27/20; B05D 5/00–5/12; B05D 7/00–7/5885
See application file for complete search history.

(56) References Cited

U.S. PATENT DOCUMENTS 5,243,255 A * 9/1993 Iwasaki ................. C03C 17/22
313/112
2005/0249939 A1 11/2005 Barkac et al.
(Continued)

FOREIGN PATENT DOCUMENTS

CN  101257980 A  9/2008
CN  102089684 A  6/2011
(Continued)

OTHER PUBLICATIONS

Haraguchi et al. "The preparation and characterization of hybrid materials composed of phenolic resin and silica". Journal of Materials Science, 33, (1998); pp. 3337-3344.*
(Continued)

*Primary Examiner* — Prashant J Khatri
(74) *Attorney, Agent, or Firm* — Studebaker & Brackett PC

(57) ABSTRACT

Disclosed herein is a layered coating film comprising a lower coat 30 including a coloring material, an upper coat 20 superposed on the lower coat, and a protective coat 10 superposed on the upper coat. The refractive index of a film constituent of the upper coat is lower than not only that of a film constituent of the lower coat other than the coloring material but also that of a film constituent of the protective coat.

10 Claims, 3 Drawing Sheets

(51) Int. Cl.
*B32B 27/20* (2006.01)
*C25D 15/00* (2006.01)
*C25D 13/04* (2006.01)
*C25D 13/12* (2006.01)

(56) References Cited

U.S. PATENT DOCUMENTS

| | | |
|---|---|---|
| 2006/0074172 A1 | 4/2006 | Yang et al. |
| 2007/0100026 A1 | 5/2007 | Munro et al. |
| 2009/0291277 A1 | 11/2009 | Chirayil et al. |
| 2010/0003501 A1 | 1/2010 | Liu et al. |
| 2010/0136235 A1 | 6/2010 | Chirayil et al. |
| 2013/0038939 A1 | 2/2013 | Walker, Jr. et al. |
| 2016/0256893 A1 | 9/2016 | Kato et al. |

FOREIGN PATENT DOCUMENTS

| | | |
|---|---|---|
| CN | 102119344 A | 7/2011 |
| CN | 102884453 A | 1/2013 |
| EP | 2 725 395 A1 | 4/2014 |
| JP | H09-296137 A | 11/1997 |
| JP | H11-077874 A | 3/1999 |
| JP | 2006-007006 A | 1/2006 |
| JP | 2007-182511 A | 7/2007 |
| JP | 2008-044835 A | 2/2008 |
| JP | 2008-100129 A | 5/2008 |
| JP | 2010-036138 A | 2/2010 |
| JP | 5304994 B2 | 10/2013 |
| RU | 2 430 942 C2 | 10/2011 |
| RU | 2 434 908 C2 | 11/2011 |
| WO | 2015/064015 A1 | 5/2015 |

OTHER PUBLICATIONS

Monni et al. "Structural and Physical Changes in Phenol-Formaldehyde Resol Resin as a Function of the Degree of Condensation of the Resol Solution". Industrial & Engineering Chemistry Research, 46, (2007); pp. 6916-6924.*
International Search Report issued in PCT/JP2015/005447; dated Jan. 26, 2016.

* cited by examiner

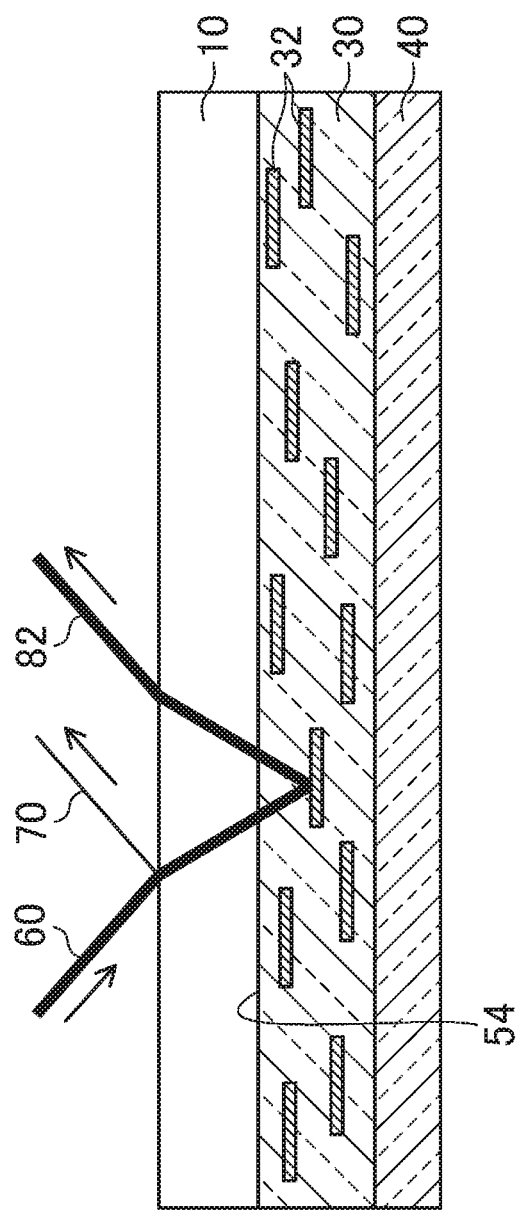

LAYERED COATING FILM, AND COATED ARTICLE

TECHNICAL FIELD

The present invention relates to a layered coating film and a coated article.

BACKGROUND ART

In coating automobile bodies and other products, a coating structure has been widely adopted where an undercoat made of a rust-preventing electrodeposition paint, an intermediate coat having the ability to conceal the undercoat, and a topcoat (a base coat and a clear coat) are superposed one upon the other in this order. In order to, e.g., save resources, an attempt has also been made to apply a topcoat directly on an undercoat without an intermediate coat. For example, a base coat having the ability to conceal an undercoat is formed on a cationic electrodeposition coat, and a clear coat is formed on this base coat.

Attempts to allow automobile coatings to have an unprecedented impressive appearance by adjusting the refractive indices of base coats and clear coats are known in the art. For example, Patent Document 1 discloses a technique for allowing the brightness of a coating to change depending on the viewing angle by setting the refractive index of the clear coat to 1.522, while setting a difference between the refractive indices of the base coat and the clear coat to 0.015 or more. Moreover, Patent Document 1 also teaches that an acrylic resin including 50 mass % or more of t-butyl methacrylate exhibits a low refractive index, and that an acrylic resin including 40 mass % or more of styrene exhibits a high refractive index.

Patent Document 2 recites that if $ZnO_2$ nanoparticles are dispersed in a resin, the resin may have an increased refractive index, and also teaches using such a resin as a coating composition.

CITATION LIST

Patent Documents

Patent Document 1: Japanese Unexamined Patent Publication No. 2006-007006
Patent Document 2: Japanese Unexamined Patent Publication No. 2008-044835

SUMMARY OF THE INVENTION

Technical Problem

Coatings are applied primarily for the purpose of imparting an unprecedented impressive design to the article to be coated. In recent years, individual likings have become so diversified that some people prefer highly glossy coatings with a lustrous surface. However, a technique to produce such a highly glossy and lustrous coating cannot be derived from any of the patent documents cited above.

In view of the foregoing background, it is therefore an object of the present invention to provide a layered coating film and coated article with a highly glossy and lustrous appearance.

Solution to the Problem

A layered coating film according to the present invention includes: a lower coat including a coloring material; an upper coat superposed on the lower coat; and a protective coat superposed on the upper coat. The refractive index of a film constituent of the upper coat is lower than not only the refractive index of a film constituent of the lower coat other than the coloring material but also the refractive index of a film forming constituent of the protective coat.

As used herein, the term "coloring material" refers to a component such as a pigment or a dye providing a color to a coating.

According to this configuration, part of the light incident on the layered coating film is reflected over a full wavelength range from the surface of the protective coat and from the interface between the upper coat and the lower coat. In this way, the light is reflected from these two points, by which the luster of the surface may be increased.

In an exemplary embodiment of the present invention, the film constituent of the upper coat includes a resin and nanoparticles having a lower refractive index than the resin. Thus, the refractive index of the upper coat may be easily adjusted to a lower level.

In another exemplary embodiment of the present invention, the film constituent of the lower coat other than the coloring material includes a resin and nanoparticles having a higher refractive index than the resin. Thus, the refractive index of the lower coat may be easily adjusted to a higher level.

In still another exemplary embodiment of the present invention, the film constituent of the protective coat includes a resin and nanoparticles having a higher refractive index than the resin. Thus, the refractive index of the protective coat may be easily adjusted to a higher level.

In yet another exemplary embodiment of the present invention, the lower coat includes a bright material. Thus, the layered coating film comes to exhibit a brilliant color.

In yet another exemplary embodiment of the present invention, the lower coat is formed on a white base member. Thus, even without the bright material, the color of the layered coating film is clearly perceivable to the viewer.

A coated article according to the present invention comprises, as its coating, a layered coating film according to any of the embodiments described above.

Advantages of the Invention

In a layered coating film according to the present invention, a part of the light incident on the layered coating film is reflected over a full wavelength range from the surface of the protective coat and from the interface between the upper coat and the lower coat. Thus, the reflected light increases in amount, so that the surface may have increased luster and gloss.

BRIEF DESCRIPTION OF THE DRAWINGS

FIG. 3 is a schematic cross-sectional view of a layered coating film according to a comparative example.

DESCRIPTION OF EMBODIMENTS

Figure 1:
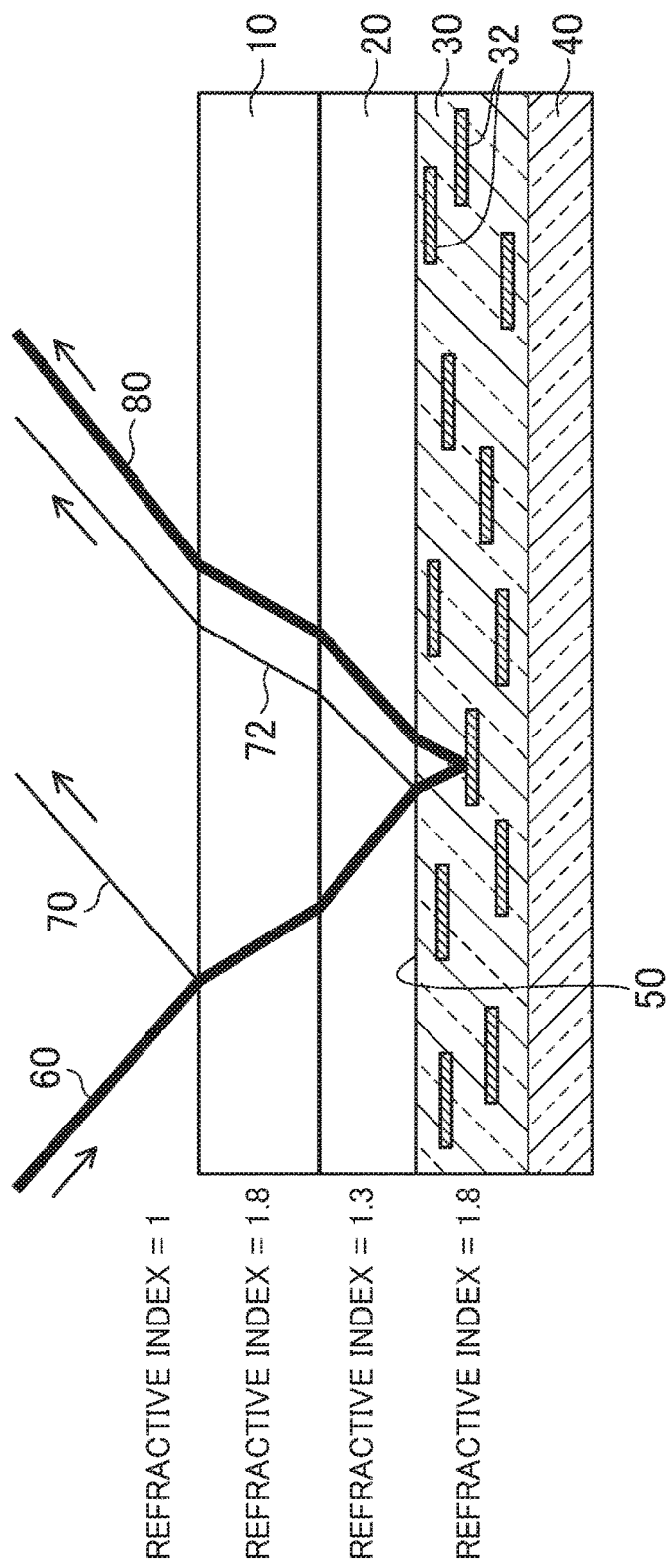
FIG. 1 is a schematic cross-sectional view of a layered coating film according to an embodiment.

Embodiments of the present invention will now be described in detail with reference to the accompanying drawings. Note that in the following drawings, components having substantially the same functions are denoted by the same reference characters for the sake of simplicity.

First Embodiment

As shown in FIG. 1, a layered coating film according to a first embodiment has a three-layer structure comprising, from top to bottom, a protective coat 10, an upper coat 20, and a lower coat 30 in this order. Further, a base layer (base member) 40 is provided under the lower coat 30. The protective coat 10 is colorless and transparent, and may be made of, e.g., a synthetic resin. The upper coat 20 is colorless and transparent, and may be made of, e.g., a synthetic resin. The lower coat 30 is colored and transparent, contains a bright material 32 reflecting light, and may be made of a synthetic resin containing, e.g., a coloring material and the bright material 32.

The refractive index of an acrylic resin commonly used for coating automobile bodies is 1.5. In the present embodiment, the refractive index of a film constituent of the protective coat 10 is 1.8, as shown in FIG. 1, which is higher than the refractive index of the acrylic resin, and considerably higher than the refractive index of the air being 1.0. The refractive index of a film constituent of the upper coat 20 is suitably lower than that of the protective coat 10, and may be 1.3 in this embodiment. The refractive index of a film constituent of the lower coat 30 other than the coloring material and the bright material 32 is suitably higher than that of the film constituent of the upper coat 20, and may be 1.8 in this embodiment.

Beneficially, the refractive indices of a film constituent of the protective coat 10 and of a film constituent of the lower coat 30 are higher than 1.5, and more beneficially higher than 1.6. Beneficially, the refractive index of a film constituent of the upper coat is higher than or equal to 1.2 and less than 1.5, and more beneficially in the range of 1.2 to 1.4. Such a configuration is beneficial because a high refractive index of the protective coat 10 increases the amount of a light beam 70 reflected from the surface of the protective coat 10.

In order to achieve such refractive indices, in the present embodiment, the same film constituent is used for both of the protective coat 10 and the lower coat 30. Specifically, the film constituent is comprised of a synthetic resin such as an acrylic resin, a urethane resin, or an epoxy resin with inorganic nanoparticles added to it to control the refractive index. The film constituent of the upper coat 20, too, is comprised of a synthetic resin such as an acrylic resin, a urethane resin, or an epoxy resin with a different type of inorganic nanoparticles added to it to control the refractive index. Examples of such inorganic nanoparticles that increase the refractive index include $ZrO_2$, $ZnO$, and $TiO_2$ nanoparticles. Examples of inorganic nanoparticles that decrease the refractive index include $SiO_2$, $CaF_2$, and $MgF$ nanoparticles. The value of the refractive index of a film constituent may be controlled by the type and amount of nanoparticles added.

Although the particle size of the nanoparticles is not particularly limited as long as their size can be regarded as a nanometer scale, those nanoparticles usually have a size of 20 nm or less. If the particle size exceeded 20 nm, the transparency could diminish, e.g., when the nanoparticles are dispersed in a resin. The nanoparticles suitably have a particle size of 1 nm to 19 nm, and more suitably have a particle size of 2 nm to 18 nm.

To measure the particle size of the nanoparticles, a common measurement technique may be employed. The nanoparticles may be observed with magnification through, e.g., a transmission electron microscope (TEM), a field emission transmission electron microscope (FE-TEM), or a field emission scanning electron microscope (FE-SEM) and the lengths of 100 randomly selected particles may be measured in the major axis direction thereof. The mean value of the lengths thus measured may be defined as their particle size. The particles may come in various different shapes, such as spheres, ellipsoids, cubes, cuboids, pyramids, needle-like shapes, column-like shapes, rods, cylinders, scales, plates or flakes. Yet, when the particle size of the particles is measured, their length is supposed to be measured in the major axis direction thereof.

The base layer 40 is a two-layered coat including an undercoat and an intermediate coat superposed on the undercoat. The undercoat is an epoxy-based cationic electrodeposition paint formed on, for example, a surface of a coated steel article (e.g., an outer plate of an automobile body). The intermediate coat has the ability to conceal the undercoat to improve the light-degradation resistance, chipping resistance, and coloring property of the base layer 40. Almost no light is reflected from the interface between the lower coat 30 and the base layer 40.

In the layered coating film according to the present embodiment, a part of incident light 60 is reflected, over a full wavelength range of the incident light 60, from two points, namely from the surface of the protective coat 10 and the interface 50 between the upper coat 20 and the lower coat 30. Note that reflected light beams 70, 72 are only a part of the incident light, and that most of the incident light enters the protective coat 10 and the lower coat 30. The light entering the lower coat 30 is entirely absorbed into the coloring material, except for only a part of the light the wavelength of which falls within a particular wavelength range, and thus turns into light of a particular color (e.g., a color red). Then, the light of the particular color is reflected by the bright material 32 from the lower coat 30 toward the upper coat 20. Finally, the light of the particular color passes through the protective coat 10, turns into an outgoing light beam 80, and comes out of the layered coating film.

When a person views the layered coating film of the present embodiment from the outside, the outgoing light beam 80 and the reflected light beams 70, 72 enter the person's eye. The outgoing light beam 80 is a light beam of the particular color, while the reflected light beams 70, 72 are light beams falling within the entire wavelength range just like the incident light 60, thus providing the coating with luster and gloss. Hence, the layered coating film of the present embodiment appears in the particular color featuring a glossy and lustrous appearance.

In the present embodiment, there are the two reflected light beams 70, 72, which is why the amount of reflected light increases and the luster and gloss intensify. For example, a layered coating film according to a comparative example, as shown in FIG. 3, has the same film structure as the layered coating film of the first embodiment but without the upper coat 20. In this case, nearly no reflection occurs at the interface 54 between the protective coat 10 and the lower coat 30, which is why the reflected light beam 70 mostly comes out of the surface of the protective coat 10. However, the amount of the outgoing light beam 82 increases slightly by the absence of the light that would otherwise be absorbed into the upper coat. Thus the layered coating film according to this comparative example lacks luster and gloss. The layered coating film according to the first embodiment, by contrast, features a more highly lustrous and glossy appearance creating a sensation of luxury.

The amount of the reflected light beams 70, 72 is determined by the amount of incident light and by the reflectance. The reflectance increases with an increasing difference between the refractive indices of the media on both sides of a reflecting surface. The interface 50 between the upper coat 20 and the lower coat 30 has a refractive index difference of 0.5. An amount of light impinging on the interface 50 is obtained by subtracting, from the incident light 60, the amount of light reflected from the surface of the protective coat 10 and the amount of light absorbed into the protective coat 10 and the upper coat 20. However, in the present embodiment, the protective coat 10 has a high refractive index of 1.8, which is why the difference between the refractive index of the protective coat 10 and the refractive index of the air is 0.8. Thus, the light beam 70 reflected from the surface of the protective coat 10 is greater in amount than the light beam 72 reflected from the interface 50 between the upper coat 20 and the lower coat 30.

A common acrylic resin has a refractive index of 1.5, and its surface has a perpendicular reflectance (relative to the air) of 4%. On the other hand, the surface of the protective coat 10 of the present embodiment has a perpendicular reflectance of 8.16%. Note that if the refractive index of the protective coat 10 is 1.6, the perpendicular reflectance of the surface of the protective coat 10 is 5.3%. The perpendicular reflectance of the interface 50 between the upper coat 20 and the lower coat 30 is 2.6%.

The present embodiment comprises two layers of transparent coat. The refractive index of the protective coat 10, which is the upper layer of the dual transparent coats, is set to be relatively high. The refractive index of the upper coat 20, which is the lower layer of the dual transparent coats, is set to be lower than the refractive indices of the protective coat 10 and lower coat 30. Therefore, the amount of the reflected light beams 70, 72 increases, thus intensifying the glossy and lustrous appearance of the coating. Since the refractive index of each coat is adjusted by addition of inorganic nanoparticles, a desired refractive index may be easily achieved.

First Example

As a layered coating film according to a first example, a layered coating film having the structure shown in FIG. 1 and the composition shown in the following Table 1 was formed.

TABLE 1

| First Example | | Solid Content by Mass (%) |
|---|---|---|
| Protective Coat | Resin: Acrylic-Based Resin | 60 |
| | Nanoparticles: $ZrO_2$ | 40 |
| Upper Coat | Resin: Acrylic-Based Resin | 60 |
| | Nanoparticles: $SiO_2$ | 40 |
| Lower Coat | Resin: Acrylic-Based Resin | 17.54 |
| | Nanoparticles: $ZrO_2$ | 40 |
| | Coloring Material: Quinacridone Magenta | 17.1 |
| | Coloring Material: Perylene | 12 |
| | Coloring Material: Carbon Black | 1.36 |
| | Bright Material: Aluminum Flakes | 12 |

As the "acrylic-based resin" in Table 1, an acrylic resin (acid value: 20 mg KOH/g; hydroxyl value: 75 mg KOH/g; number average molecular weight: 5000; and solid content: 60% by mass) manufactured by NIPPONPAINT Co., Ltd was used. As the nanoparticles contained in the protective coating film 10 and the lower coat 30, a $ZrO_2$ nanoparticle dispersion liquid ($ZrO_2$ solid content: 20% by mass) manufactured by Sumitomo Osaka Cement Co., Ltd. was adopted. As the nanoparticles contained in the upper coat 20, $SiO_2$ nanoparticles (Nano Tek Slurry ($SiO_2$ solid content: 20% by mass) manufactured by C. I. Kasei Co., Ltd.) was used. Further, as a pigment included in the lower coat 30, quinacridone magenta (Chromofine manufactured by Dainichiseika Color & Chemicals Mfg. Co., Ltd.), perylene (Paliogen Maroon L3920 manufactured by BASF), and carbon black (Carbon Black #2650 manufactured by Mitsubishi Chemical Corporation) were employed. Aluminum flakes (76 Series manufactured by Toyo Aluminium K.K.) were used as the bright material included in the lower coat 30. The refractive indices of the protective coat 10, upper coat 20, and lower coat 30 were 1.8, 1.3, and 1.8, respectively.

Figure 2:
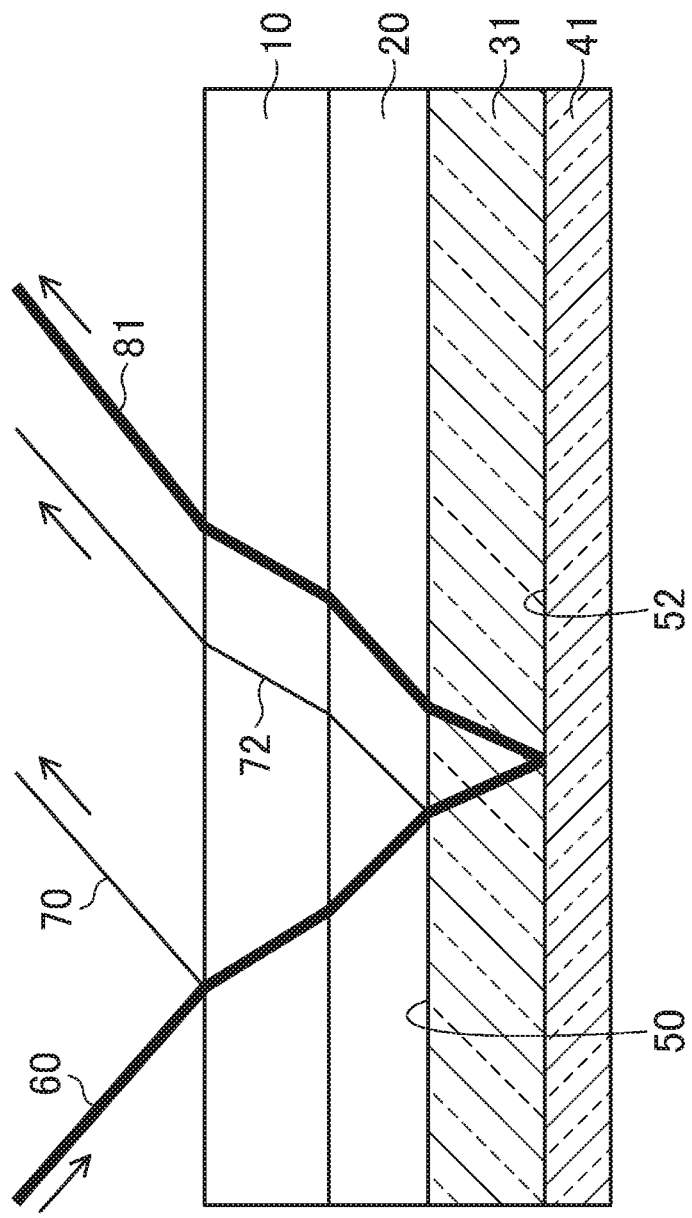
FIG. 2 is a schematic cross-sectional view of a layered coating film according to another embodiment.

A layered coating film having the structure shown in FIG. 2 and including a protective coat 10 and a lower coat 30 having the composition shown in Table 1 was formed as a layered coating film according to a first comparative example.

When the layered coating film according to the first example and the layered coating film according to the first comparative example were observed outdoors, the layered coating film according to the first example apparently looked like having a more glossy and lustrous color red than the layered coating film according to the first comparative example.

Second Embodiment

A layered coating film according to a second embodiment has the structure shown in FIG. 2. The layered coating film of the second embodiment differs in two respects from the counterpart of the first embodiment. Specifically, the bright material 32 is not included in its lower coat 31, and its base layer 41 (base member) is white so that light is reflected from the interface 52 between the base layer 41 and the lower coat 31. Apart from these features, the layered coating film of the second embodiment is the same as the one of the first embodiment.

In the layered coating film of the second embodiment, no bright material 32 is used but light is reflected from the interface 52 between the base layer 41 and the lower coat 31 and turns into an outgoing light beam 81. As a result, the color of the outgoing light beam 81 is not as brilliant as the one in the first embodiment, but the luster and gloss are the same as in the first embodiment.

Other Embodiments

The embodiments described above are mere examples of the claimed invention. However, the present invention is not limited to these examples. Instead, these examples may be combined with well-known, commonly used or publicly known art, or may be partly replaced. Further, modifications that would easily occur to a person skilled in the art are also included in the scope of the invention claimed.

Constituent materials that make the layered coating films according to the embodiments and examples may be replaced with other materials. For example, a resin other than an acrylic-based resin may be used, and a pigment of a different color and type may also be adopted. Further, nanoparticles of a different type may be employed, too. Moreover, the refractive indices of the respective layers are not limited to the above values, either. As a bright material, copper flakes may be used as well.

DESCRIPTION OF REFERENCE CHARACTERS

10 Protective Coat
20 Upper Coat
30 Lower Coat
31 Lower Coat
32 Bright Material
40 Base Layer (Base Member)
41 Base Layer (Base Member)

The invention claimed is:

1. A layered coating film comprising:
a lower coat including a coloring material;
an upper coat superposed on the lower coat; and
a protective coat superposed on the upper coat, wherein
the refractive index of a film constituent of the upper coat is lower than not only the refractive index of a film constituent of the lower coat other than the coloring material but also the refractive index of a film forming constituent of the protective coat,
the film constituent of the upper coat includes a resin and nanoparticles having a lower refractive index than the resin, and
the upper coat and the protective coat are colorless and transparent.

2. The layered coating film of claim 1, wherein the film constituent of the lower coat other than the coloring material includes a resin and nanoparticles having a higher refractive index than the resin.

3. The layered coating film of claim 1, wherein the film constituent of the protective coat includes a resin and nanoparticles having a higher refractive index than the resin.

4. The layered coating film of claim 2, wherein the film constituent of the protective coat includes a resin and nanoparticles having a higher refractive index than the resin.

5. The layered coating film of claim 1, wherein the lower coat includes a bright material.

6. A layered coating film comprising:
a lower coat including a coloring material;
an upper coat superposed on the lower coat; and
a protective coat superposed on the upper coat, wherein
the refractive index of a film constituent of the upper coat is lower than not only the refractive index of a film constituent of the lower coat other than the coloring material but also the refractive index of a film forming constituent of the protective coat,
the film constituent of the upper coat includes a resin and nanoparticles having a lower refractive index than the resin, and
the lower coat is formed on a white base member.

7. A coated article comprising:
a layered coating film as a coating of the coated article, the layered coating film including
a lower coat including a coloring material;
an upper coat superposed on the lower coat; and
a protective coat superposed on the upper coat, wherein
the refractive index of a film constituent of the upper coat is lower than not only the refractive index of a film constituent of the lower coat other than the coloring material but also the refractive index of a film forming constituent of the protective coat,
the film constituent of the upper coat includes a resin and nanoparticles having a lower refractive index than the resin, and
the lower coat is formed on a white base member.

8. The layered coating film of claim 7, wherein the film constituent of the lower coat other than the coloring material includes a resin and nanoparticles having a higher refractive index than the resin.

9. The layered coating film of claim 7, wherein the film constituent of the protective coat includes a resin and nanoparticles having a higher refractive index than the resin.

10. The layered coating film of claim 7, wherein the lower coat includes a bright material.

* * * * *